United States Patent
Papandreou et al.

(10) Patent No.: US 11,756,644 B2
(45) Date of Patent: Sep. 12, 2023

(54) TRIAGE OF MULTI-PLANE READ REQUESTS

(71) Applicant: International Business Machines Corporation, Armonk, NY (US)

(72) Inventors: Nikolaos Papandreou, Thalwil (CH); Nikolas Ioannou, Zurich (CH); Roman Alexander Pletka, Uster (CH); Radu Ioan Stoica, Zurich (CH); Charalampos Pozidis, Thalwil (CH); Timothy J. Fisher, Cypress, TX (US); Andrew D. Walls, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 17/355,720

(22) Filed: Jun. 23, 2021

(65) Prior Publication Data
US 2022/0415424 A1 Dec. 29, 2022

(51) Int. Cl.
*G11C 16/26* (2006.01)
*G11C 29/42* (2006.01)
*G11C 29/44* (2006.01)
*G11C 29/12* (2006.01)
*G11C 29/18* (2006.01)

(52) U.S. Cl.
CPC .......... *G11C 29/42* (2013.01); *G11C 29/1201* (2013.01); *G11C 29/12005* (2013.01); *G11C 29/18* (2013.01); *G11C 29/4401* (2013.01)

(58) Field of Classification Search
CPC .............. G11C 29/42; G11C 29/12005; G11C 29/1201; G11C 29/18; G11C 29/4401; G11C 16/0483; G11C 16/28; G11C 16/3418; G11C 16/3422
See application file for complete search history.

(56) References Cited

U.S. PATENT DOCUMENTS

| | | | |
|---|---|---|---|
| 7,383,375 B2 | 6/2008 | Sinclair | |
| 7,949,819 B2 | 5/2011 | Kang et al. | |
| 8,347,042 B2 | 1/2013 | You | |
| 9,465,732 B2 | 10/2016 | Manohar et al. | |
| 10,884,915 B1 | 1/2021 | Kuzmin et al. | |
| 2015/0220269 A1 | 8/2015 | Lee et al. | |
| 2020/0192735 A1 | 6/2020 | Ioannou et al. | |

FOREIGN PATENT DOCUMENTS

| | | |
|---|---|---|
| CN | 101923448 B | 12/2012 |
| TW | 202038097 A | 10/2020 |

*Primary Examiner* — Alfredo Bermudez Lozada
(74) *Attorney, Agent, or Firm* — Peter J. Edwards

(57) ABSTRACT

A memory controller receives a multi-plane read request and identifies a set of actual read offsets for a set of pages in the multi-plane read request. The memory controller calculates a common read offset using the set of actual read offsets. The memory controller calculates an offset difference for. Each page. Each offset difference reflects the difference between an actual read offset for that page and the common read offset. The memory controller compares a particular page's offset difference to an offset difference threshold. The memory controller categorizes, based on the comparing, a first subset of pages from the set of pages into a single plane group and a second subset of pages from the set of pages into a multi-plane group. The memory controller performs a multi-plane read on the multi-plane group.

20 Claims, 8 Drawing Sheets

US 11,756,644 B2

TRIAGE OF MULTI-PLANE READ REQUESTS

BACKGROUND

The present invention relates to accessing data in storage, and more specifically, to multi-plane read commands.

Typical memory systems utilize a memory controller to respond to write and read requests sent to the memory system. A memory controller may respond to a read request by locating the address of the data that is requested and sending that data to the requesting entity (e.g., a central processing unit).

Some memory systems utilize memory chips that contain multiple storage planes. In these memory systems, each storage plane may share the same general structure as each other storage plane. Typically, storage planes have an independent set of blocks, pages, and memory cells. In these memory systems, a memory controller may respond to write and read requests for data on each storage plane.

SUMMARY

Some embodiments of the present disclosure can be illustrated as a method comprising receiving a request for a multi-plane read for a first page and a second page. The method also comprises identifying a first read offset for the first page and a second read offset for the second page. The method also comprises calculating a common offset for the first page and a second page. The method also comprises calculating a first offset difference between the first read offset and the common offset. The method also comprises calculating a second offset difference between the second read offset and the common offset. The method also comprises determining that the first offset difference and the second offset difference are bound by a common-offset threshold. The method also comprises adding the first page and second page to a primary multi-plane group based on the determining. The method also comprises performing a multi-plane read on the primary multi-plane group.

Some embodiments of the present disclosure can also be illustrated as a computer program product. The computer program product comprises a computer readable storage medium that has program instructions embedded therewith. The program instructions are executable by a memory controller to cause the memory controller to receive a multi-plane read request for a set of pages. The program instructions also cause the memory controller to perform a pre-categorization triage on the set of pages. The program instructions also cause the memory controller to determine, based on the pre-categorization triage, whether to exclude the set of pages from a multi-plane read. The program instructions also cause the memory controller to perform, for pages of the set of page that are excluded from multi-plane reads in the pre-categorization triage, single plane reads. The program instructions also cause the memory controller to perform, for pages of the set of pages that are not excluded from multi-plane reads in the pre-categorization triage, multi-plane categorization. The multi-plane categorization comprises identifying a set of actual read offsets for the set of pages. The multi-plane categorization also comprises calculating a common read offset using the set of actual read offsets. The multi-plane categorization also comprises calculating, for each particular page in the set of pages, an offset difference. Each offset difference reflects the difference between an actual read offset for that particular page and the common read offset. The multi-plane categorization also comprises determining, for each particular page in the set of pages, whether the offset difference for that particular page is below a difference threshold. The multi-plane categorization also comprises categorizing, based on the determination, pages from the set of pages whose offset differences are below the difference threshold into a multi-plane group. The multi-plane categorization further comprises categorizing, based on the determination, pages from the set of pages whose offset differences are above the difference threshold into a single-plane group. The program instructions also cause the memory controller to perform, for the pages categorized into the multi-plane group, a multi-plane read.

Some embodiments of the present disclosure can also be categorized as a memory controller configured to perform a method. The method comprises receiving a multi-plane read request. The method also comprises identifying a set of actual read offsets for a set of pages in the multi-plane read request. The method also comprises calculating a common read offset using the set of actual read offsets. The method also comprises calculating an offset difference for each particular page in the set of pages. Each offset difference reflects the difference between an actual read offset for that particular page and the common read offset. The method also comprises comparing for each particular page in the set of pages, that particular page's offset difference to an offset difference threshold. The method also comprises categorizing, based on the comparing, a first subset of pages from the set of pages into a single-plane group. The method also comprises categorizing, based on the comparing, a second subset of pages from the set of pages into a multi-plane group. The method also comprises performing a multi-plane read on the multi-plane group.

DETAILED DESCRIPTION

Figure 1:
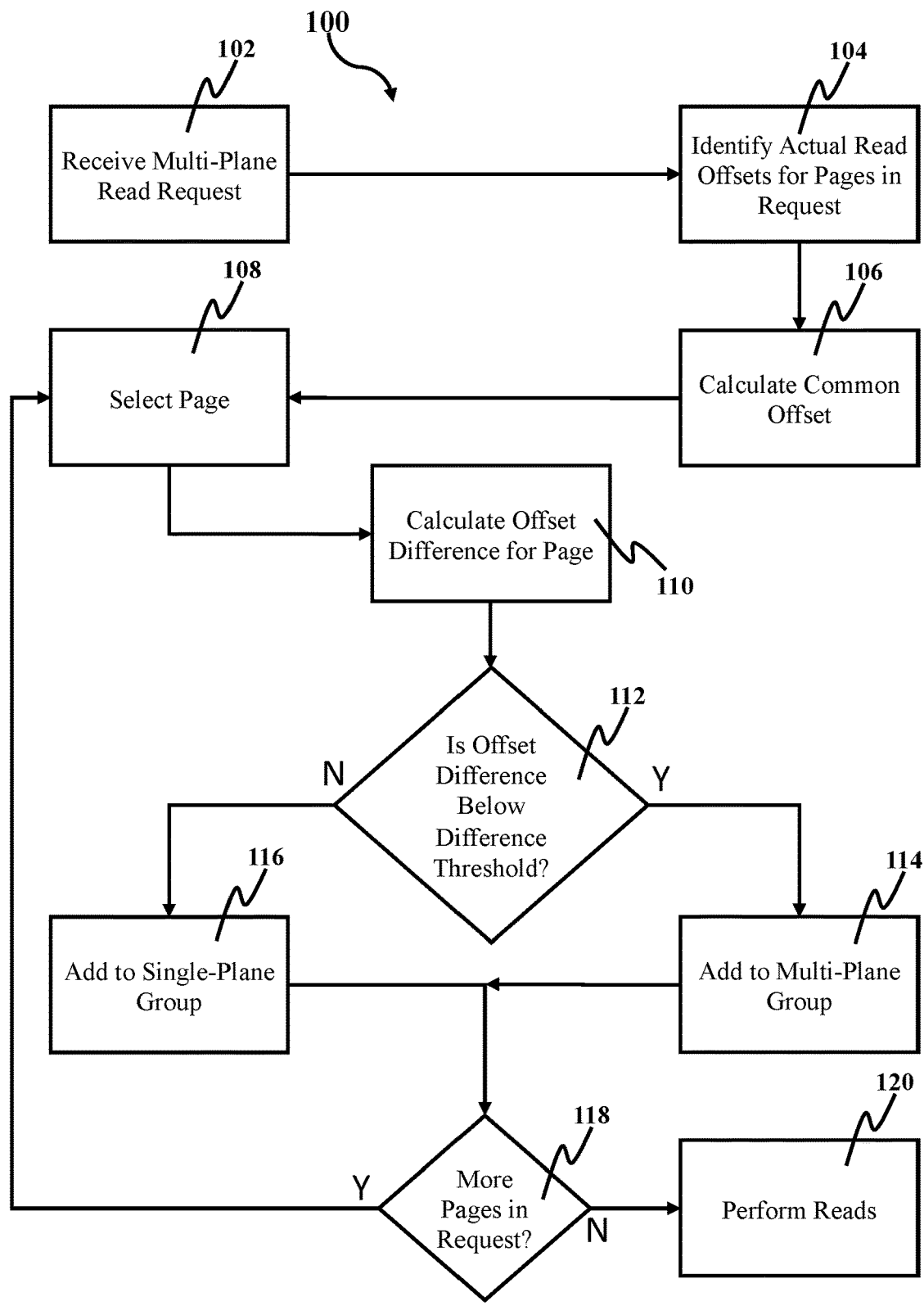
FIG. 1 illustrates a method of grouping pages into a multi-plane group and a single-plane group based on page read-voltage offsets, in accordance with embodiments of the present disclosure.

In some memory technologies, such as NAND flash, the organization of the memory array in a memory chip can be expressed as a hierarchal structure. At a high level, a memory chip contains one or more physical structures to which data for a system can be stored. These structures are often referred to herein as "blocks." Each block contains a set of "pages", e.g. 2048 pages. Each of these pages is a group of memory cells connected by the same word-line, and each memory cell may contain one or more bits that can be used to store data as a logical "0" or a logical "1." In a multi-bit NAND flash, each word-line contains as many pages as the number of bits stored in the memory cells. For example, in QLC NAND flash, a memory cell can store up to 4 bits of information and thus each word-line in a block contains four pages. Each of these pages contain the bits of the same significance (e.g., the digit in a four digit binary number, such as 0001) from all the cells in the corresponding word-line. Further, all pages in a block that carry the bits of the same significance in the various word-lines of the block are said to be of the same page "type."

For example, "b3b2b1b0" may denote the 4 bits stored in each cell of a particular QLC NAND flash chip. In this example, the page type that contains the least-significant bits "b0" from all the cells of a particular word-line may be referred to as the "lower page type." Further, the page type that contains the bits "b1" may be referred to as the "upper page type." The page type that contains the bits "b2" may be referred to as the "extra page type," and the page type that contains the most-significant bits "b3" may be referred to as the "top page type." As noted, these page-type names are examples. The names of the page types may vary based on the design of the chip and may also differ between memory chip manufacturers.

Modern memory chips typically organize multiple blocks in "planes" and each block typically uses the same scheme for page addresses (also referred to as a "page offsets"). For example, the very first page in each block may all have the address "0000" (also referred to as an "offset" of "0000"), and the $200^{th}$ page in each block may all have the address "0199."

In some memory chips, pages can be written to or read from in parallel (i.e., at the same time) as other pages in different planes if those pages share the same page address (i.e., page offset) in their blocks. As will be discussed, this can significantly increase the write and read bandwidth. Typically, the pages with the same address in a block are of the same page type. Multi-package NAND memory devices contain multiple chips (or dies) and the above structures and features are typically found on each chip of the device.

NAND flash blocks are filled by writing the pages in the block sequentially (e.g., from page 0 to 2047 in a block with 2048 pages). When data is written to typical NAND chips for a particular purpose (e.g., to store data for an application or a database), it is assigned a page in a block. The data for that purpose can then be written to the cells of that page (e.g., page 2001). If the data fills up that page, the purpose is assigned the next page (e.g., page 2002). Further, for some purposes that are expected to store a very large amount of data (either immediately or over a non-immediate period of time), a memory system can assign multiple pages to that purpose at one time. For this reason, when a memory system stores a large amount of data for a particular purpose, that data is sometimes distributed across multiple consecutive pages on a memory chip.

Once data is stored on a NAND chip, a memory controller can request the data from the cells on a page by sending an appropriate read command to the memory chip that, typically, includes an address indicator of the plane address, the block address and page address where the data is physically stored. The memory chip reads the data by applying a set of read voltages to those cells and returns the data to the memory controller. The number of possible read voltages depends on the NAND flash technology. For example, in QLC NAND there are 16 discrete level distributions and thus the memory chip uses 15 read voltages to detect the level stored in each cell and therefore the corresponding bit information. Depending on the page type a subset of those read voltages is used to read the data corresponding to the respective page. The assignment of read voltages to page types may vary based on the memory chip design. These aspects are discussed further in FIG. 6.

The absolute voltage values applied may also depend on several factors. For example, memory chips of different designs can require different voltages to read the data on the chip. Further, the location of a page within a block, and the location of a block within a plane can impact the absolute voltage values required to read data. These factors typically do not change as a memory chip is used, and can be used to determine a theoretical set of read voltage values (also referred to as a "nominal set of read voltage values") that is based solely on the design of the chip, but does not account for real-world measurements or adjustments.

However, the theoretical read voltage values for any particular page on a memory device may need to be shifted throughout the lifetime of that device. For example, long-term patterns (e.g., the number of times a cell has been written to over its lifetime), short-term patterns (e.g., how long a cell has held a particular bit of data or how many times it has been read since the last time it was programmed), and immediate usage patterns (e.g., the current block activity) can also impact the voltages that are necessary to accurately read the data stored on for a page. In other words, a difference between the theoretical read voltages and the actual read voltages can develop and change as a NAND chip is used.

This shift between the theoretical ideal read voltage value and the actual ideal read voltage value for a particular page may be referred to herein as the "read-voltage offset" or "read offset" for that page. As a memory device is used, a memory controller typically tracks the read offsets for each page of the device. This read offset can then be used by the memory controller to request the memory chip via a specific command to adjust the theoretical voltage for a page when data is read from that page. When a page involves multiple read voltages, as discussed above, the controller may need to send multiple specific commands with the read offset for each of those voltages depending on the command implementation. Typically, these specific commands are sent prior to the page read command.

In some NAND memory devices, a single memory chip can also contain multiple physical planes. The number of planes on a single memory chip varies based on the design of the chip. In memory devices with more than one plane, the above structures and features are typically found on each plane of the device. For example, each plane of a multi-plane memory chip typically contains a set of blocks, pages, and cells that can be written to and read from independently of the other planes on the chip.

In some memory systems, a continuous group of pages that are dedicated to a particular purpose must be stored on a single plane. This is referred to as "single-plane addressing"). For example, a memory controller may simultaneously dedicate three pages to a database when that database is stored on a memory chip with two planes. In single-plane addressing, the memory controller may assign that database to three pages on the first plane or to three pages on the second plane.

However, typical memory systems also allow addressing between multiple planes of a memory chip. This is referred to herein as "multi-plane addressing." In multi-plane addressing, a continuous group of pages that are dedicated to a particular purpose may be stored across multiple planes. For example, if the same database above utilized three pages on a two-plane memory chip that supported multi-plane addressing, the first page may be stored at the first page address of the first plane, the second page may be stored at the first page address of the second plane, and the third page may be stored at the second page address of the first plane.

Multi-plane addressing can offer significant performance advantages. For example, some memory systems can read from multiple planes of a chip simultaneously. This can, in some instances, enable a memory system to read a set of pages distributed across a set of planes significantly faster, because the memory system could read multiple of those pages at (approximately) a single time. This practice is often referred to herein as a "multi-plane read." For example, if a memory controller received a request to read a first page on a first plane and a second page on a second plane, it may be possible to read those two pages simultaneously, reducing the overall read time. By contrast, if those pages were stored on a single plane, most memory systems would need to read them in sequence, significantly extending the overall read time. This practice is often referred to herein as a "single-plane read". Each page read comprises three low level operations: the amount of time involved with processing and issuing a read command, the amount of time involved with actually performing the read operation to access the data from the given page in the given plane, and the amount of time involved with actually extracting the data read from the given page. A multi-plane read completely parallelizes performing the read operation, which is significantly more time consuming than the other two operations, thus taking time close to the total time it takes to read one page.

Note that the advantages of multi-plane read operations are not limited to the data placement of applications such as databases where continuous data is written to pages with the same page indexes on different planes. Even when data from different applications or volumes are mingled, a controller can optimize the execution of read operations by grouping pages of the same page address from multiple planes and issuing multi-plane read operations and so returning data for different applications or volumes by issuing a multi-plane read operation. Depending on the NAND flash interface for multi-plane read operations, some NAND flash devices might further support grouping pages of distinct page addresses from multiple planes as one skilled in the art would appreciate.

Multi-plane reads can significantly improve performance in specific circumstances. For example, a set of 20 sequential pages may be written to multiple planes. In other words, the first page may be written to, for example, page address 0034 in a block on plane 1 and the second page may be written to page offset 0034 in a block on plane 2, and so on for a group of 20 pages. Assuming the pages are written to a NAND flash chip with 4 planes, this would result in the group of pages utilizing page addresses 0034 through 0038 of a block on each plane. When these pages are read, all pages with page address 0034 could be read simultaneously, followed by the pages with page address 0035, and so on. As a result, the system could read the set of 20 pages (approximately) four times as fast as when using single-plane reds.

This performance is also true when performing garbage collection on the system. In garbage collection, a group of blocks on each plane may be emptied to eliminate empty space or unused data. In these situations, the numbers of pages that need to be read to perform the operation can be extremely high. However, by utilizing multi-plane reads in a NAND flash with 4 planes, the pages in blocks belonging to different planes can be read in groups of 4, reducing the total garbage collection time significantly. The previous example use cases are by no means limited or restrictive use cases of multi-plane read operations or the advantages thereof.

Performing multi-plane reads can improve read performance, but several requirements must be met before performing a multi-plane read. For example, in a typical implementation of a multi-plane read, each page is required to have the same page address in a block on its plane as the other pages have in their blocks on their corresponding planes. For example, if pages A and B were spread across two planes, a multi-plane read may be possible if both pages A and B were the seventh page in their respective blocks. However, a multi-plane read would not be possible if page A was the 4th page in its block on the first plane and page B was the 5th page in its block on the second plane.

These features make it possible to reduce the amount of time that a memory controller must spend accessing each page to be read in a multi-plane read. For example, if a memory controller received a read request for four pages distributed at the same page addresses throughout four planes, the memory controller may recognize that a multi-plane read would be possible. At that point, the memory controller could send a command to read all four pages simultaneously.

As discussed above, usage differences between the individual pages of the planes may result in the ideal voltages for the corresponding pages on each plane to shift differently. For this reason, the individual pages in a multi-plane read may feature different read-voltage offsets, and thus the ideal read voltage value for those pages may, in practice, differ. In other words, two pages with the same addresses on their corresponding planes may require different voltages to be applied to them in order for a memory controller to read the data they contain.

Unfortunately, in many implementations of a multi-plane read, only a single set of read-voltage offsets can be applied to all pages in each plane prior to the multi-plane read command. Thus, if the read offsets of the pages in a multi-plane read are significantly different, a single set of read offsets applied to those pages may result in one or more of the pages being read incorrectly. When this happens, a high bit error count may occur and in the case where the bit errors cannot be corrected by the system's error correcting code (ECC), a decoding failure (specifically, a "read error") occurs, and the pages that are erroneously read must typically be read again using a single-plane read.

Unfortunately, performing one or more single-plane reads after a multi-plane read can take approximately the same amount of time as two separate reads. This effectively doubles the amount of time it takes to read the data required by the system, and can delay queued read requests as well. This can result in a significant performance hit to the system. If read errors occur frequently as a result of multi-plane reads, the theoretical performance benefit to the system of multi-plane reads may be completely negated by the aggregated performance detriments of the read errors that result from those multi-plane reads. In typical cases, overall system performance would be far greater if a memory controller performed single-plane reads on those pages that are likely to result in read errors, rather than attempting to include those pages in a multi-plane read.

Some embodiments of the present disclosure address the above-identified issues with multi-plane reads by performing various levels of triage on the pages for which a multi-plane read is requested. For example, in some embodiments, the read offsets for the pages in the multi-plane read request can be used to calculate a common offset for the request. As described above, depending on the page type, a subset of read voltages are used by the chip to read the data, from the set of all read voltages available depending on the NAND flash technology. Therefore, the terms read offset refers to the set of read offset values for all read voltages employed when reading a respective page type. This concept is discussed further in FIG. 6.

That common offset can be used, in some embodiments, as the actual offset for the multi-plane read request. Further, any pages in the request whose read offsets are sufficiently different from the common offset may not be included in the multi-plane read. This may prevent increased bit errors on those pages whose offset value is significantly different from the common calculated offset. In some embodiments, a memory controller may perform a single-plane read on the pages that are not included in the multi-plane read. In this case, the controller may send a specific command to the memory chip to adjust the read voltages based on the read offset of the corresponding page in the single-plane read prior to the respective single-plane read command.

For example, in some embodiments, a memory controller may separate the pages in a multi-plane read request into single-plane and multi-plane groups based on the differences between the pages' individual actual read offsets and a calculated common offset. This common offset may be calculated, for example, by identifying the average of the individual read offsets of the pages included in the multi-plane read request. The memory controller may compare the difference between each page's actual offset and the common offset (sometimes referred to herein as the "offset difference" for a page) to a common-offset threshold. If a page's offset difference is greater than (and, in some embodiments, equal to) that common-offset threshold, the memory controller may add that page to a single-plane group. If the page's offset difference is less than (and, in some embodiments, equal to) the threshold, the memory controller may add that page to a multi-plane group.

In some embodiments, the memory controller may refine the common offset of the multi-plane group after the pages are initially separated into groups. For example, a common offset for a multi-plane group that includes 4 pages may have been calculated as −100 mV. However, one of those four pages may have been placed into a single-plane group. Further, that single-plane page may have had a read offset that was significantly more negative than all three of the pages in the multi-plane group. This could have skewed the common offset to be far more negative than the read offsets of the three multi-plane pages. In some circumstances, this could result in the multi-plane read returning an increased bit error count for one of those three pages (e.g., the page with the highest ideal offset) because the ideal read voltage of that page may be too different than the read voltage calculated with the common offset.

Thus, the memory controller may calculate a refined common offset using only the read offsets of the pages that are inserted into a multi-plane group. In the example above, the memory controller may calculate a refined offset using the three multi-plane pages. This may result in a refined common offset of −30 mV rather than −100 mV, which may be significantly closer to the offsets of the three multi-plane pages. Thus, rather than send a command to decrease the read voltage by 100 mV, the memory controller may send a command to decrease the read voltage by 30 mV. Or, in some embodiments, the memory controller may not even send voltage values, but may send a decrement command of −3 (for −30 mV) instead of −10 (for −100 mV). This command may then be interpreted by the chip, which may alter the read voltage accordingly. This may avoid a read error that would otherwise have occurred during the multi-plane read.

Removing pages from a multi-plane read based on those pages' read offsets may be beneficial because it may enable the multi-plane read to be performed without resulting in read errors. However, removing multiple pages may sometimes result in several single-plane reads also being performed, which may significantly increase the overall read time. In some instances, this may be unavoidable. However, in some instances, several pages that were removed from the multi-plane read may be combined into a secondary multi-plane read, reducing the total amount of reads being performed. This may mitigate the performance inefficiencies caused be performing multiple reads, reducing the overall read time.

For example, if a memory controller receives a multi-plane read request for 4 pages, the memory controller may determine that two of those four pages have ideal offsets that are very close to a common offset, and two of those four pages may have ideal offsets that are significantly different than the common offset. Thus, the memory controller may place the first two pages into a multi-plane read group and the third and fourth pages in a single-plane read group. However, if those third and fourth pages have ideal offsets that are, while significantly different than the common offset, very close together, those two pages could be read simultaneously with a second multi-plane read.

Thus, in some embodiments of the present disclosure, a memory controller may calculate a secondary common offset for a single-plane read group and determine whether the ideal offsets for the pages within the single-plane read group are close enough to that secondary common offset to justify a second multi-plane read. For example, the memory controller may identify a secondary offset difference for each page by calculating the difference between each page's ideal offset and the secondary common offset. Those secondary offset differences could then be compared to an offset-difference threshold, and any pages whose offset differences are bound by the threshold (e.g., less than or equal to the threshold) could be combined in a secondary multi-plane group.

As discussed, some embodiments of the present disclosure group pages in a multi-plane read request based on those pages ideal read offsets. However, in some instances and for some page types, a risk of multi-plane read errors is high enough that performing a pre-categorization triage on the read request before pages are grouped may be beneficial. For example, some page requests may contain pages that, due to their page type, page address, or usage history, are very sensitive to read errors. In these instances, defaulting to a single-plane read for all pages, or performing a stricter triage of the pages based on ideal read offsets, may save time and avoid read errors.

For example, in some embodiments, statistics for each page included in a multi-read request may be gathered when the request is received. These page statistics may include, for example, the frequency of increased number of read errors that occurred relative to the address or the type of the pages that are part of the multi-plane reads. For example, a range of page addresses of specific page type (e.g., the "top pages") in the address range 1750-2047 in a QLC NAND block that has 2048 pages may be more sensitive to read errors than other pages and page types in the address range 0-1749. Thus, identifying a set of sensitive page addresses and page types may suggest that those pages are particularly sensitive to read errors when anything but the exact ideal read offset is used for those pages.

In some embodiments, usage data for the pages may also be collected. For example, if a page has not been written to for a long period of time, (i.e., the page has a high retention time), that page may be more sensitive to deviations in ideal read offset than if the page had been written to recently. Further, if a page has been written to or read from a large number of instances over the lifetime of the page, the page may also be particularly sensitive to deviations in ideal read offset.

In some embodiments, certain page statistics may be placed on a multi-plane-read exclusion list. In these embodiments, any pages that are identified as having these statistics may be automatically excluded from a multi-plane read. Further, in some embodiments, individual pages may be placed on an exclusion list based on previous performance. For example, if a memory controller identifies that all previous multi-plane read attempts of a particular page have resulted in read errors, that individual page may be placed on an exclusion list. In these embodiments, this exclusion list could be compared to the page statistics identified by the memory controller upon receipt of the multi-plane read request. If the page statistics are on the exclusion list, the memory controller may determine to perform single-plane reads for the corresponding pages, without analyzing the read offsets of those pages.

In some embodiments, a memory controller could calculate a risk factor for each page included in a multi-plane read request, or for the group of pages. A risk factor may reflect a likelihood that a read error would result if that page (or group of pages) were included in a multi-plane read. In these embodiments, this risk factor could be compared to one or more thresholds to determine whether a multi-plane read should be performed on those pages, and what the conditions of the multi-plane read should be. For example, for particularly large risk factors, the memory controller could exclude a page from multi-plane reads. For moderate risk factors, the memory controller could proceed to group a page with a multi-plane-read group, but may use a smaller-than normal offset-difference threshold when analyzing the offsets for the pages in the multi-plane read request. For particularly small risk factors, the memory controller could proceed to analyze the offset differences of the pages as normal.

FIG. 1 illustrates a method 100 of grouping pages into a multi-plane group and a single-plane group based on page read offsets. Method 100 may be performed, for example, by a memory controller in a memory system. The memory system may contain, for example, a NAND memory chip with multiple planes.

Method 100 begins in block 102, in which the memory controller receives a multi-plane read request for a set of pages. As used herein, a multi-plane read request refers to a request to read several pages that could theoretically be read using a multi-plane read. For example, a memory controller may receive a request to read data from several pages with the same page address across several planes of a memory module. For the purpose of explanation, these "several" pages shall be referred to as P1, P2, P3, and P4, and shall be described as being stored on planes 1, 2, 3 and 4 (respectively). That said, the embodiments of the present disclosure could be used in systems with fewer or more than four planes, as well as in response to multi-plane read requests with more-than-four or fewer-than-four pages. As discussed previously, typical memory systems require that pages in multi-plane reads belong to different planes and have the same address on their corresponding blocks with other pages in the read request. In this instance, that suggest that pages P1, P2, P3, and P4 may all be found on at page number 103 on their corresponding blocks on planes 1, 2, 3, and 4. Moreover, as discussed above, the controller can send, prior to the multi-plane read command, a specific command to the memory chip to adjust the read voltages for the respective page type of the pages in the multi-plane read. This specific command contains a set of read offset values for the corresponding read voltages of the respective page type.

However, as discussed above, the unique properties and usage statistics of each individual page may cause different shifts in each page's actual read-voltage offsets. Thus, in block 104, the memory controller identifies the actual page read offsets for the pages involved in the requested multi-plane read (here, P1, P2, P3, and P4). As is also discussed above, these shifts may be regularly tested and recorded by the memory controller in a typical memory system. Thus, block 104 may involve the memory controller looking up the stored actual read offsets for each page.

The actual read offset for each page may represent the changes from the theoretical read voltage that are necessary to apply the ideal read voltage for each page. For example, block 104 may include identifying an actual offset of −25 mV for page P1 and −50 mV for page P2. By applying a page's actual offset during a page read, the chances of a read error can be significantly reduced. Thus, in method 100, the memory controller determines whether a read voltage that is close enough to the ideal read voltage of all pages can be applied.

For this reason, the memory controller calculates, in block 106, a common offset using the actual read offsets identified in block 104. This may be performed for all read voltages of the page type being read. For example, in some implementations, an "extra" page type may have four read voltages that may be necessary to confidently retrieve the data in the corresponding page. Each of those voltages may have a different ideal offset for each page, and thus a common offset for each of the four voltages for each page may be calculated. This concept is discussed further with respect to FIG. 6. As used throughout this disclosure, the term "common offset" for a group of pages may refer to a single offset for a single read voltage for those pages, or for all offsets for all the read voltages for those pages.

The calculation used to arrive at the common offset may also vary based on the implementation of method 100. For example, in some embodiments the simple average or the median of all actual read offsets identified in block 104 may be calculated. In some embodiments, the midpoint between the highest offset and the lowest offset may be calculated. This method may be a quick way to calculate the approximate average of the group of pages. However, while this may be a valuable method in some implementations, in some instances it may include a possible disadvantage. Specifically, using the midpoint between the highest and lowest offsets may increase the effect that outlier offsets have on the common offset. For example, if three pages had relatively close offsets (e.g., −20 mV, −15 mV, and −22 mV) and one page had an outlier offset (e.g., +40 mV), taking the midpoint of −22 mV and +40 mV may cause the outlier offset to have a large impact on the common offset, potentially creating a common offset that would result in read errors for the three pages with relatively close offsets.

In some embodiments, the effects of outlier offsets may be mitigated by emphasizing the offsets that are NOT the most positive and the most negative. For example, an average of all identified actual offsets could be calculated, but offsets that are not the most positive or most negative could be weighted by added them to the calculation twice. Additionally, offsets that are the most positive or most negative could be negatively weighted by dividing them by 2 before calculating a common offset. As another example, offsets that are determined to be outliers (e.g., through statistical analysis) may be ignored when calculating the common offset.

Once the common offset is calculated in block 106, the memory controller may proceed to group the pages that are part of the multi-plane read request into a single-plane group or a multi-plane group. This process may start in block 108, in which the memory controller selects a page from the read request to categorize. Block 108 proceeds to block 110, in which the memory controller determines offset difference for the page by subtracting the page's actual offset (identified in block 104) from the calculated common offset (calculated in block 106), or vice versa, and taking the absolute value of that result. This offset difference may represent the difference between the ideal read voltage for the page and the read voltage that would be applied based on the calculated common offset.

In block 112, the memory controller determines whether the offset difference for the page is within an offset difference threshold. As the risk of read errors for a page increases as the size of the offset difference increases, an offset difference above the difference threshold may signify a high risk of a read error for a page. Thus, the determination in block 112 may be useful for predicting whether applying a read voltage that is based on the common offset would result in a read error for the page if the page were included in a multi-plane read. For this reason, the determination in block 112 can be used to group the page into a multi-plane group or a single plane group.

In some embodiments, this threshold may be customized based on balancing the interest in avoiding read errors and the interest pursuing the performance benefits of successful multi-plane reads. For example, in implementations in which avoiding errors is particularly important, the difference threshold may be set particularly low (e.g., 20 mV). Such a low threshold may be very effective at removing high-risk pages from multi-plane reads, but may also result in single-plane reads being performed on some pages that could be included in a multi-plane read. In other words, some performance benefits of multi-plane reads may be sacrificed in order to avoid read errors. On the other hand, in implementations in which the potential performance benefits of multi-plane reads are particularly valued, the difference threshold may be set particularly high (e.g., 80 mV). Such a high threshold may be less likely to remove pages from the multi-plane read that would not result in read errors, but may also be less likely to remove pages from the multi-plane read that WOULD result in errors.

In typical implementations, a middle ground between a very high and very low difference threshold may be employed. The difference threshold may also be based on the properties of the system or the pages involved in the request. For example, if the usage history of the system indicates a higher historical rate of read errors than is expected, the difference threshold could be adjusted lower. However, if the usage history indicates almost no read errors, the difference threshold could be adjusted higher to attempt to increase performance by including more pages in multi-plane reads.

Further, if the memory controller determines that, due to the properties of the pages in the multi-plane read request, the pages are particularly error prone, the memory controller may decrease the difference threshold. More details of an embodiment with this adjustment are provided in method 500 in FIG. 5.

If the memory controller determines, in block 114, that the offset difference for the page is below (or, in some embodiments, equal to) the difference threshold, the memory controller adds the page to a multi-plane group in block 114. The pages in the multi-plane group may be grouped together in anticipation of being included in a multi-plane read. On the other hand, if the memory controller determines that the offset difference for the page is above the difference threshold, the memory controller adds the page to a single-plane group in block 116. Pages are added to the single-plane group in anticipation of not being included in the primary multi-plane read.

The memory controller then proceeds to block 118, in which it determines whether there are more pages in the request received in block 102 that have not yet been categorized into the multi-plane group or the single-plane group. If more pages are discovered, the memory controller returns to block 108 to select another page. If more pages are not discovered, however, the memory controller proceeds to block 120 to perform one or more reads on the categorized pages. This may include, for example, performing a multi-plane read on the pages in the multi-plane group, which may include some, but not all, the pages identified in the multi-plane read request. This may also include performing one or more single-plane reads on pages that were not added to the multi-plane group. Further, if only one page was added to the multi-plane group in method 100, the memory controller may perform a single-plane read on that page, and use the page's actual offset rather than the common offset.

In some embodiments, "preforming reads" in block 120 may include sending a command to a memory module or memory chip to adjust one or more read voltages for the corresponding pages based on the offsets for those pages. For example, if a multi-plane group comprises 3 pages, block 120 may include sending a command (prior to the multi-plane read) to adjust the read voltage for a multi-plane read for those pages based on a common offset calculated in block 106. If a single-plane group was formed in block 116, block 120 may also include sending a command (prior to each single-plane read) to adjust the read voltage for the page (or pages) in that single-plane group based on the ideal shifted offset(s) for that page (or those pages).

Further, as discussed above (and in more detail with respect to FIG. 6), some page types in multi-bit NAND flash, such as TLC NAND or QLC NAND, may have multiple read voltages that are applied for a single read in order to identify the bits stored in that page. Further, as discussed with respect to block 106, each of those voltages may also have their own relevant actual read offsets. Thus, in some embodiments "performing reads" in block 120 may include sending a command to adjust each one of those voltages by the appropriate offset. For example, a multi-plane group formed in block 114 may include 2 top pages. These top pages may have 8 read voltages for identifying the bits held in the page. As discussed above, a unique common offset may have been calculated in block 106 for each of those voltages. Thus, in this example, block 120 may include sending one or more commands to alter each of those 8 read voltages by their corresponding 8 common offsets that were calculated for the 2 top pages.

Further, in some embodiments, the memory controller may attempt to refine the common offset (or offsets) to be more fitted to the pages in the multi-plane group prior to sending a command to adjust one or more read voltages by the common offset a memory module in block 120. More details of an embodiment with this refinement are provided in method 300 of FIG. 3.

In some embodiments, the memory controller may attempt to perform a secondary (or tertiary, etc.) multi-plane read on some pages that were categorized into the single-plane group based on their actual offsets. More details of an embodiment with a secondary multi-plane read are provided in method 400 in FIG. 4.

Figure 2:
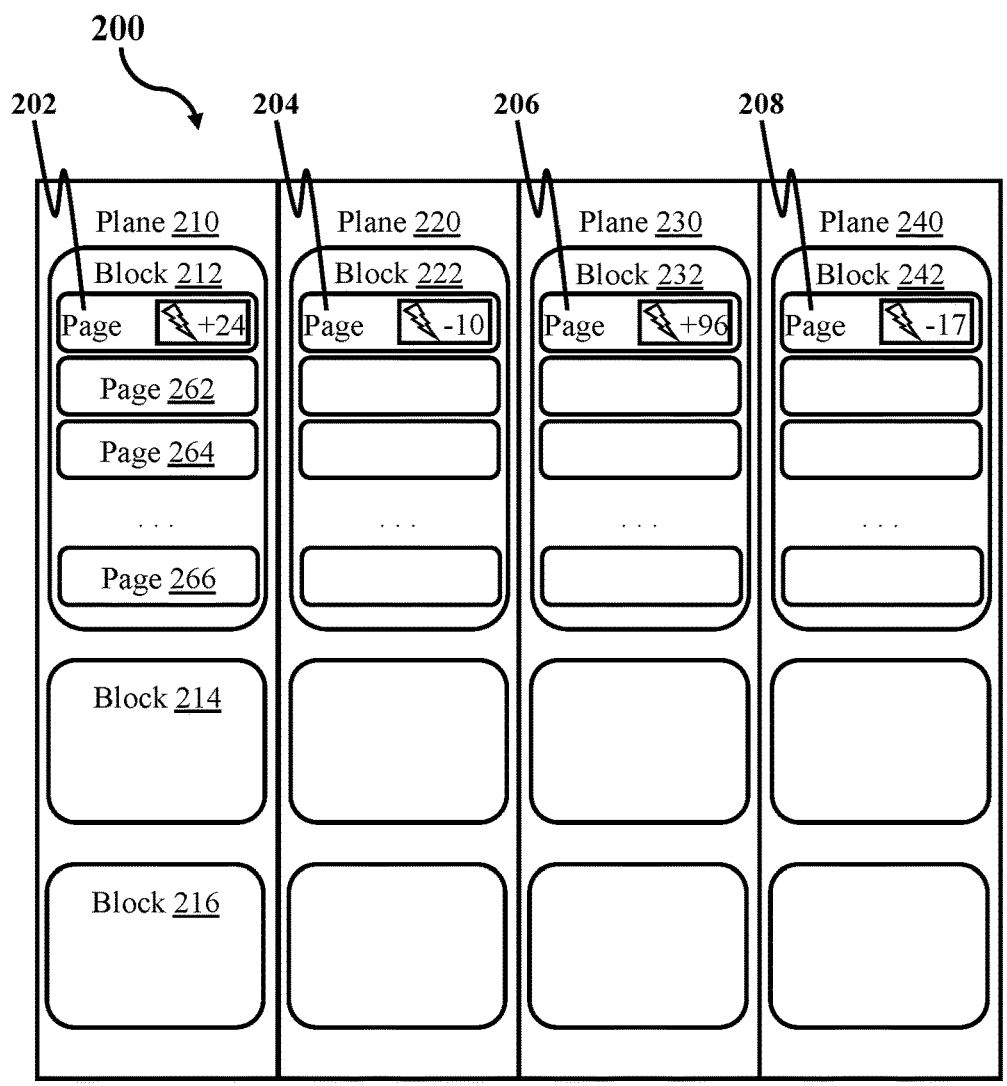
FIG. 2 illustrates an abstract diagram of a memory module with four planes with pages that can be grouped in accordance with embodiments of the present disclosure.

In the interests of understanding, FIG. 2 illustrates an abstract diagram of a memory module 200 with four planes 210, 220, 230, and 240 with pages that can be grouped in accordance with embodiments of the present disclosure. As will be described, the components of memory module 200 have been presented in a simplistic, abstracted manner. As such, the sizes and positions of the components of memory module 200, as well as the labels thereof, are presented solely for the purpose of explaining the methods of the present disclosure. They are not intended to place any limitations on the size, scale, or layout of a memory module on which those methods could be performed.

Each of planes 210, 220, 230, and 240 contain blocks that each contain individual pages. For example, plane 210 contains blocks 212-216. Block 212 is illustrated as containing pages 202, 262, 264, and 266. Blocks 214 and 216 may be largely equivalent or identical to block 212, but are presented without pages for the sake of simplicity. Further, while only four pages are illustrated in block 212, block 212 may contain many more pages (e.g., a total of 4096 pages). Similar to plane 210, planes 220, 230, and 240 contain blocks 222, 232, and 242 respectively. These blocks may be similar to block 212 of plane 210. Of note, many of the components of planes 220, 230, and 240 have not been individually labeled. This is, again, for the sake of simplicity. These components may be similar to corresponding components of plane 210. For example, each of blocks 222, 232, and 242 contain a series of pages. While block 212 contains page 202 in its first page slot (i.e., page address), block 222 contains page 204 in its first page slot, block 232 contains page 206 in its first page slot, and block 242 contains page 208 in its first page slot. Memory module 200 may utilize multiplane addressing, and thus pages 202 through 208 may be designated to a single application/purpose, and may thus contain a continuous set of data, despite being located on different planes.

The blocks in memory module 200 may utilize the same page address organization. For example, the first page in each block (e.g., pages 202, 204, 206, and 208) may each have the address "0000." The next page in each block (e.g., page 262) may have the address "0001." The third page in each block (e.g., page 264) may have the page address "0002." This may continue until the last page in each block (e.g., page 266), which may have the page address "4095."

Pages 202 through 208 may be included in a multi-plane read request received by the memory controller. The memory controller could analyze the properties of pages 202 through 208 to estimate a likelihood that the pages would cause a read error if included in a multi-plane read, given that only a single set of read offset values can be used for all pages of the multi-plane read, and remove pages that are estimated to have a high risk of read errors from the multi-plane read.

Prior to the multiplane-read command, the memory controller could send a specific command to the memory chip with a single set of read offsets that will be applied to all pages in the multi-plane read request. Thus, the memory controller could, as discussed in method 100 of FIG. 1, identify the actual read offsets of each of pages 202, 204, 206, and 208 and use them to create a common offset.

The actual read-voltage offsets to be used for each page are illustrated by a vector number (i.e., a number with a positive or negative direction) in a box with a lightning bolt. For example, the actual read offset for page 202 is 24 mV above the nominal read voltage. The actual read offset for page 204 is 10 mV below the nominal read voltage. Similarly, the actual read offset for page 206 is 96 mV above the nominal read voltage, and the actual read voltage for page 208 is 17 mV below the nominal read voltage.

As discussed with respect to FIG. 1, a memory controller could calculate the common offset in a variety of ways. For example, a simple average of the actual offsets for page 202-208 would result in a common offset of +23.25 mV. An average of the highest offset (+96 mV) and the lowest offset (−17 mV) would result in the midpoint between the two, and a common offset of +39.5 mV. However, both of these common offsets may not be ideal for most of pages 202-208 due to the impacts of page 206's ideal offset, which is a significant outlier. Including such an outlier in a calculation of the common offset may lead to a high number of read errors, or may even prevent a multi-plane read completely. For example, if the above common offset of +39.5 mV were used and an offset difference threshold of 40 mV were employed, a memory controller may only place page 202 in a multi-plane group, as only page 202 has an actual offset within 40 mV of +39.5 mV. This may result in no multi-plane read being performed. Similarly, if the common offset of +23.25 mV were used with the difference threshold of 40 mV, only pages 202 and 204 would be placed within the multi-plane group. However, by mitigating or eliminating the effects of the outlier offset, a common offset that is closer to a larger number of pages may be calculated.

For this reason, some embodiments of the present disclosure may calculate a common offset by weighting the two offsets that are not the most positive or most negative. For example, if the offsets for pages 202 and 204 were counted twice, the sum of the offsets would be +107 mV. Dividing that by six (for pages 202 through 208 and the duplicates of 202 and 204) would result in a common offset of +17.83 mV. If an offset difference threshold of 40 mV were used, this common offset would result in all of pages 202, 204, and 208 being placed into a multi-plane group. Further, if the common offset were calculated by taking the average of only the non-outlier offsets (i.e., +24 mV, −10 mV, and −17 mV), the common offset would equal −1 mV. Such a common offset would result in all three of pages 202, 204, and 208 being placed into a multi-plane group even if the threshold were as low as 26 mV.

In other words, in some implementations of the embodiments of the present disclosure, a memory controller would perform a multi-plane read of pages 202 and 204. In some embodiments of the present disclosure, a memory controller would perform a multi-plane read of pages 202, 204, and 208. By varying the method by which the common offset is calculated and the value of the offset difference threshold, the embodiments of the present disclosure could be optimized to the specific usage scenario and preferences of the owners/users of the storage system. In some embodiments, multiple calculation types or difference thresholds could be used for a single multi-plane read request to avoid situations in which the offsets of a set of pages are particularly ill fit for a particular calculation type or threshold.

As noted above, some embodiments of the present disclosure may refine a common offset for a multi-plane group after the pages of the group are set. This may be beneficial, for example, in situations in which a page is included in the multi-plane group due to the offset difference for that page being barely below the offset difference threshold. Using FIG. 2 as an example, if the common offset of 23.25 mV were used with a difference threshold of 45 mV, pages 202, 204, and 208 may be included in a multi-plane group. However, the actual ideal offset of page 208 is 40.25 mV lower than that common offset. In other words, page 208's offset difference is very close to the difference threshold, and thus the risk of read errors for page 208 may still be fairly high. However, if the offsets of the pages within the multi-plane group were used to calculate a refined common offset, the read voltage may be closer to the majority of the members of the multi-plane group. Moreover, in practice the above decimal offset values are rounded to the nearest integer value or to the nearest integer value that is a multiple of a minimum voltage step, e.g. of 10 mV. For example, a common offset of +23.25 mV is rounded to +23 mV or +20 mV. Such rounding effects may be dependent on the memory chip design or the specifics of the commands between the memory controller and the memory chip that are used to adjust the read voltages prior to a single-plane or a multi-plane read.

Figure 3:
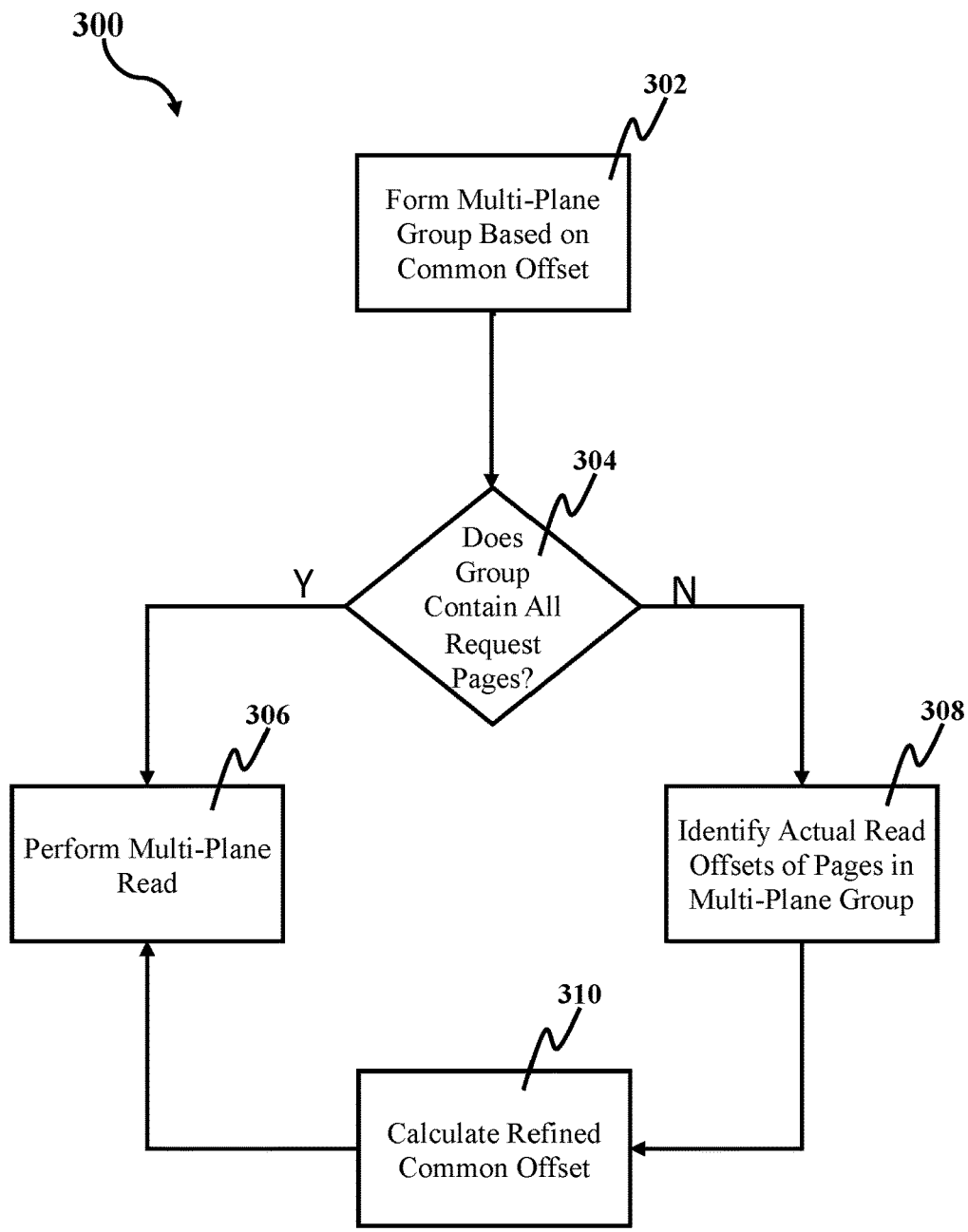
FIG. 3 illustrates a method of refining a read-voltage offset for a multi-plane group, in accordance with embodiments of the present disclosure.

FIG. 3 illustrates a method 300 of refining a common offset for a multi-plane group, in accordance with embodiments of the present disclosure. Like method 100, method 300 may be performed by a memory controller in a memory system that contains, for example, a NAND memory chip with multiple planes. Method 300 begins in block 302, in which a memory controller forms a multi-plane group based on a common offset. Method 302 may resemble, for example, the operations described in blocks 102 through 114 of FIG. 1 or with respect to memory module 200 of FIG. 2. The common offset formed in block 302 may sometimes be referred to herein as a "primary common offset" to distinguish it from a common offset calculated later in method 300, which may be referred to as a "refined common offset."

In block 304, the memory controller determines whether the multi-plane group includes all pages that were included in the original multi-plane request. For example, a memory controller performing method 300 as part of block 120 of FIG. 1 may determine whether the multi-plane group formed in the iterations of blocks 108 and block 114 contains all pages identified as part of the multi-plane read request that was received in block 102 (or, alternatively, if any pages were categorized into a single-plane group in block 116. Similarly, if a memory controller were performing method 300 with memory module 200, it may determine whether the multi-plane group included all of pages 202 through 208.

If the memory controller determines, in block 304, that the multi-plane group contains all of the originally requested pages, the memory controller may proceed to perform a multi-plane read on those pages in block 306 using the originally calculated primary common offset. However, if the memory controller determines that at least one page is not included in the multi-plane group, the memory controller proceeds to block 308, in which the memory controller identifies the actual read offsets of only the pages in the multi-plane group. For example, if a memory controller were performing method 300 with memory module 200, block 308 may include identifying the actual offsets of pages 202, 204, and 208, but not of page 206.

In block 310, the memory controller calculates a refined common offset using the actual read offsets identified in block 308. In some embodiments, the refined common offset may be calculated by finding the simple average of all the actual read offsets identified in block 308. However, in some embodiments, another method, such as the average of the highest offset and lowest offset may be utilized. In some embodiments, this may result in using a method to calculate the refined common offset that is different than the method that was used to calculate the original primary common offset in block 302 (e.g., a weighted average).

Once the refined common offset is calculated, the memory controller proceeds to block 306, at which it performs a multi-plane read on the multi-plane-group pages. As part of this multi-plane read, the memory controller may send a command to the memory chip to adjust the read voltage based on the refined common offset rather than the primary common offset calculated at block 302. The refined common offset that is calculated at block 310 may be much closer to one or more of the actual read offsets of the pages in the multi-plane group. Thus, by performing method 300, a memory controller may be able to perform a multi-plane read with a lower risk of read error.

As noted above, some embodiments of the present disclosure may attempt to combine several pages that were categorized into a single-plane group together to form a secondary multi-plane group. Referring back to the discussion accompanying FIG. 2 as an example, memory controller may have used a simple average of the highest and lowest offsets to calculate a common offset of +39.5 mV, which may have resulted in only page 202 being categorized into a multi-plane group and pages 204, 206, and 208 being placed into a single-plane group. However, pages 204 and 208 may have actual read offsets that are close enough to be placed into a secondary multi-plane group, combining two unnecessary single-plane reads into one multi-plane read.

Figure 4:
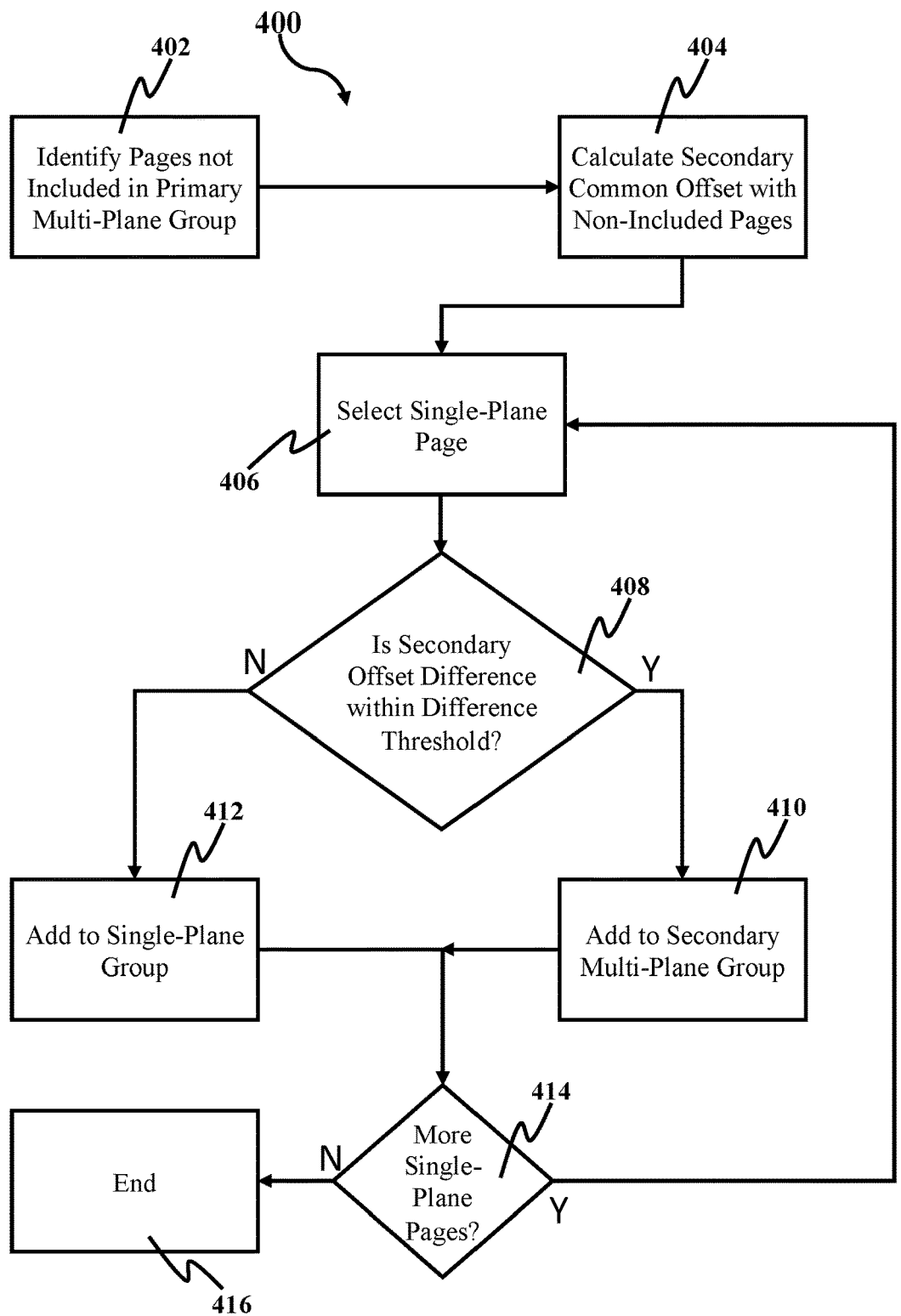
FIG. 4 illustrates a method of combining a set of pages in a single-plane group into a secondary multi-plane group, in accordance with embodiments of the present disclosure.

FIG. 4 illustrates a method 400 of combining a set of pages in a single-plane group into a secondary multi-plane group, in accordance with embodiments of the present disclosure. Like methods 100 and 300, method 400 may be performed by a memory controller in a memory system that contains, for example, a NAND memory chip with multiple planes. With respect to FIG. 4, an original multi-plane group may be referred to as a "primary multi-plane group" to distinguish it from a secondary multi-plane group. For example, if a memory controller performs method 400 as part of block 120 of method 100, the multi-plane group formed by block 114 may be referred to as a primary multi-plane group, and a multi-plane group formed by method 400 may be referred to as a secondary multi-plane group.

FIG. 4 begins in block 402, in which pages that were not included in the primary multi-plane group are identified. In some embodiments, this may include identifying pages that were categorized in a single-plane group. However, in some embodiments, a memory controller may automatically group all pages that are part of a multi-plane request in a multi-plane group by default, and simply remove pages from the primary multi-plane group based on the actual offset of those pages. In these embodiments, the pages identified in block 402 may not be in a single-plane group, but may simply have been removed from the primary multi-plane group.

In block 404, the memory controller calculates a secondary common offset using only the actual offsets of pages that were not included in the primary multi-plane group. For example, if a request for a multi-plane read included pages P1 through P4, but the primary multi-plane group included only pages P1 and P2, block 404 would calculate a secondary common offset using only the actual offsets of pages P3 and P4. This common offset is referred to herein as a "secondary common offset" to distinguish it from the common offset that was used to form the primary multi-plane group, the "primary common offset."

Once the secondary common offset is calculated, the memory controller proceeds to block 406 to select a single-plane page for categorization. The memory controller then determines, in block 408, whether that page's secondary offset difference is within a difference threshold. The operations of block 408 may resemble those of blocks 110 and 112 of FIG. 1. Specifically, the memory controller may calculate the secondary offset difference for the selected page by subtracting the actual offset for the page from the secondary common offset and finding the absolute value of that number. The memory controller may then compare that secondary offset difference to a difference threshold. This difference threshold may be the same threshold that was used to form the primary multi-plane group (e.g., the threshold used in block 112 of FIG. 1), or it could be a larger or smaller threshold, referred to herein as a secondary difference threshold. Using a smaller secondary difference threshold in block 408 may help to avoid read errors by combining single-plane pages that have a high sensitivity to read-voltage deviations. In other words, a higher standard may be required to combine single-plane pages into a secondary multi-plane group in method 400 than was used to combine pages into a primary multi-plane group.

If the memory controller determines, in block 408, that the secondary offset difference is within the difference threshold, it adds the selected page to a secondary multi-plane group in block 410. Otherwise, the memory controller adds the selected pages to a single-plane group in block 412. In some embodiments, block 412 may involve creating a new single-plane group and adding the selected page to it, keeping the selected page in an already-existing single-plane group, or returning the selected page to a single-plane group.

From either block 410 or block 412, the memory controller proceeds to determine, in block 414, whether there are any more single-plane pages that were identified in block 402 but have not yet been categorized in blocks 406 through 412. If there are more single-plane pages, the memory controller returns to block 406. If, however, all single-plane pages have been categorized, the method ends in block 416.

The operations after block 416 may depend on the implementation and on whether multiple pages were added to a secondary multi-plane group in block 410. For example, if all pages identified in block 402 were added to a single-plane group in block 412, the memory controller may perform a single-plane read on all pages in the single-plane group. However, if more than one pages was added to the secondary multi-plane group, the memory controller may perform a secondary multi-plane read on those pages. Further, if some pages were added to the secondary multi-plane group and some pages were added to the single-plane group, the memory controller may perform a secondary multi-plane read and one or more single-plane read. Further, in some embodiments, a memory controller may calculate a refined secondary common offset using the actual offsets of only the pages added to the secondary multi-plane group, similar to method 300 of FIG. 3.

As discussed above, some embodiments of the present disclosure attempt to group pages into single-page groups and multi-page groups based on the actual read offsets of those pages. In some of these embodiments, this categorization can result in a large reduction of read errors in multi-plane reads, which may also result in a large reduction in performing subsequent single-plane reads to make up for those errors.

However, in some implementations, read errors may still occur even when using the above-described methods. In some of these use cases, these read errors may be avoided if stricter offset-difference thresholds are utilized to prevent high-risk pages (i.e., pages with a high risk of causing a read error if included in a multi-plane read) from being categorized in multi-plane groups. Similarly, in some of these cases, system performance may be improved in the long run if groups of high-risk pages are identified before pages are categorized based on actual read offset. In these implementations, triaging multi-plane requests before categorization may cancel some multi-plane reads, but may avoid enough read errors to be worth performing.

Figure 5:
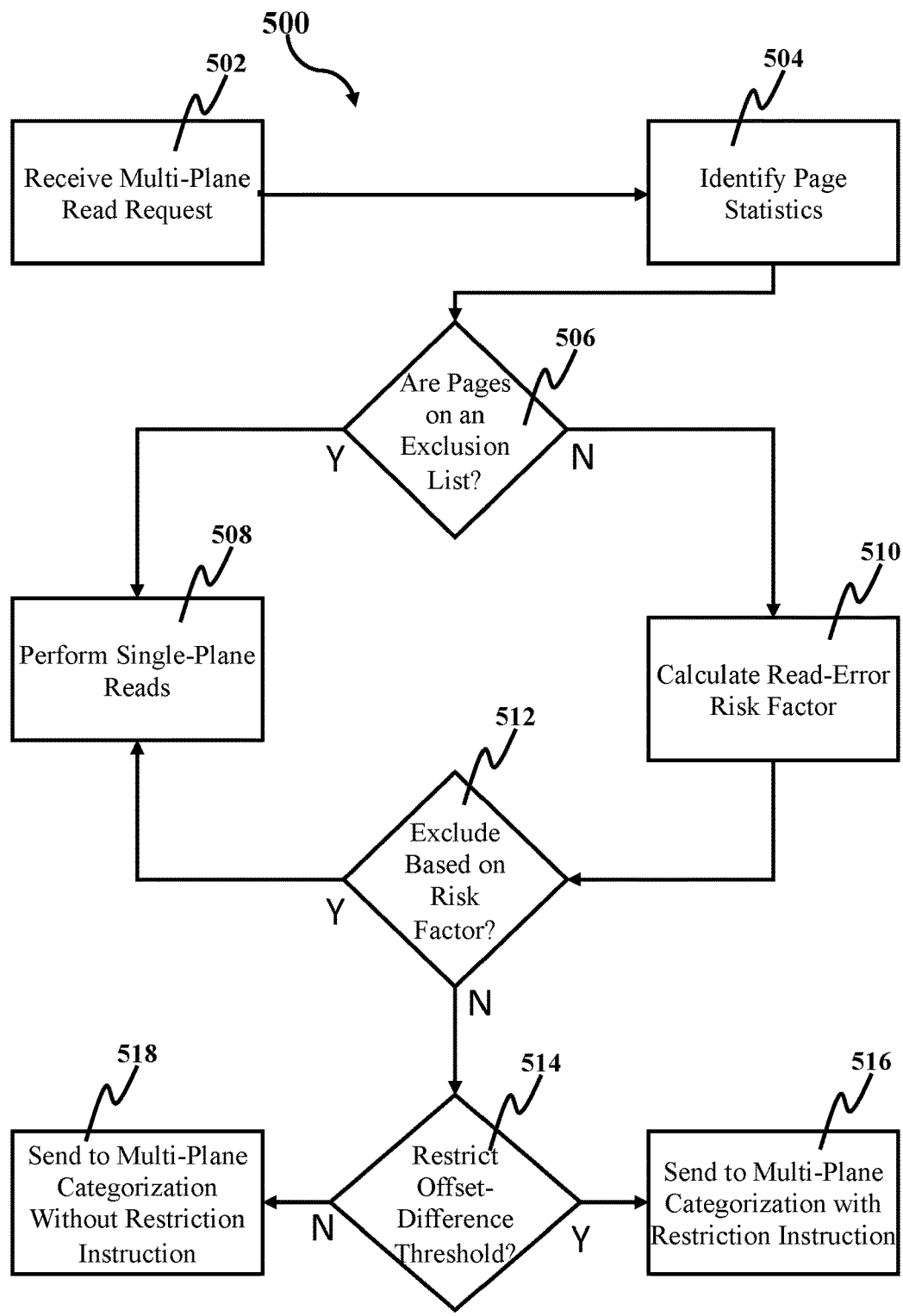
FIG. 5 depicts a method of performing pre-categorization triage on a set of pages before categorizing into a multi-plane group, in accordance with embodiments of the present disclosure.

FIG. 5 depicts a method 500 of performing pre-categorization triage on a set of pages before categorizing into a multi-plane group based on read offsets, in accordance with embodiments of the present disclosure. Like methods 100, 300, and 400, method 500 may be performed by a memory controller in a memory system that contains, for example, a NAND memory chip with multiple planes.

FIG. 5 begins in block 502, in which the memory controller receives a multi-plane read request for a set of pages. The memory controller begins pre-categorization triage on those pages by identifying page statistics for the pages in block 504. These page statistics may include, for example, address data for the pages. This address data may provide the page type, page group, and page location on their respective planes and blocks. This may help determine which page types and page locations are typically sensitive to read-voltage deviations. For example, in some encoding schemes, pages of particular page type may have tighter read-voltage requirements. The page statistics may also include usage data for the pages. For example, if the pages are used to store information that is rewritten regularly, the number of times that the pages have been cleared and written to may have caused some degradation in the memory cells, making those pages more likely to return page errors if a read offset value that deviates from the page's actual read offset is applied. Moreover, if a particular page or set of pages has not been written to in a very long time (in other words, if the page or pages have a high "retention time"), the pages may also be sensitive to deviations in read voltage.

Once the page statistics are identified in block 504, the memory controller may determine, in block 506, if the pages are on an exclusion list. In some embodiments, this may include identifying the particular pages (e.g., by the exact address) and comparing them to a list of particular pages that are to be excluded from multi-plane reads. A page may be excluded from multi-plane reads, for example, if the page has been recorded as causing read errors in a high percentage of previous multi-plane reads. In some embodiments, block 506 may also include comparing some or all of the page statistics gathered at block 504 to a list of statistics that, if true for a page, disqualify that page for multi-plane reads. For example, in some systems, any page that has been more than 1 month in retention or has been read more than 1000 times after it was last written may be automatically excluded from a multi-plane read.

If the memory controller determines, in block 506, that the pages are on an exclusion list, the memory controller cancels the multi-plane read and performs a set of single-plane reads for the pages in block 508. However, if the memory controller determines that the pages are not on an exclusion list, the memory controller calculates a risk factor for the pages in block 510. A read-error risk factor, as used herein, may refer to a value that objectively expresses an estimation of that a page, or set of pages, would result in a read error if included in a multi-plane read. This read-error risk factor may be based on any or all of the statistics included in block 504, including the previous read-error history for the pages. The read-error risk factor may take various forms, such as a percentage, a number between 0.0 and 1.0, or a recognized descriptor such as "low," "medium," and "high."

Once the read-error risk factor is calculated in block 510, the memory controller determines, in block 512, whether the pages should be excluded from a multi-plane read based on the value of the read-error risk factor. For example, a memory controller may compare a read-error risk factor to a risk-factor threshold, such as 60% or 0.6. A memory controller may also determine whether the read-error risk factor is equal to or above a "moderately high" rating. The value of the threshold used in block 512 may therefore depend both on the type of risk factor calculated in block 510, but also on the tolerance for potential read errors in the use case. If the user or owner of a system is particularly interested in avoiding read errors, for example, a risk-factor threshold could be set particularly high, causing pages to be more likely to be excluded from multi-plane reads.

If the memory controller determines, in block 512, that a set of pages should be excluded from multi-plane reads based on the read-error risk factor, the memory controller proceeds to cancel the multi-plane read and perform single-plane reads for the pages in block 508. If the memory controller determines, however, that the set of pages should not be excluded, the memory controller proceeds to block 514 in which the memory controller determines whether the risk factor justifies restricting an offset threshold used when categorizing the pages into a multi-plane group or single-plane group.

For example, if a read-error risk factor is particularly high, but the pages are not excluded from single-plane reads in either blocks 506 or 512, the memory controller could determine that the risk of read errors is still high enough that only pages with very small offset differences should be categorized into a multi-plane group. In other words, pages whose actual offset is not very similar to a common offset calculated as part of, for example, method 100, would be added to a single-plane group rather than a multi-plane group. For example, if a memory controller were performing method 500 before method 100, the memory controller may decide, based on the read-error risk factor determined in block 510, that the difference threshold utilized in block 112 should be very low.

In some embodiments, the determination in block 514 could be based on a configuration. For example, some embodiments may allow a user of a memory system to establish that all offset-difference thresholds should be restricted/based on a read-error risk factor. In some embodiments, the determination in block 514 may be based on the size of the risk factor. For example, a memory controller may determine that the offset-difference threshold should be restricted if the read-error risk factor is over 70%.

If the memory controller determines, in block 514, to restrict the offset-difference threshold, the memory controller sends the pages to multi-plane categorization (e.g., methods 100, 300, and 400) with a restriction instruction in block 516. The form of the restriction instruction may vary based on the use case. For example, in some embodiments the memory controller may establish an offset-difference threshold in block 516. In other embodiments, the instruction may be a value to multiply a default offset-difference threshold by a multiplier. In some embodiments, this multiplier may be the read-error risk factor, or a value based on the read-error risk factor.

If the memory controller determines, on the other hand, not to restrict the offset-difference threshold, the memory controller sends the pages to multi-plane categorization without a restriction instruction.

In some embodiments of pre-categorization triage, some features of method 500 may be omitted. For example, in some embodiments, no exclusion list may be used, and thus block 504 may proceed directly to 510. In other embodiments, no risk factor may be created, and thus 506 may either proceed to block 508 or 518. In some embodiments, a risk factor may be created, but the system may not restrict offset difference threshold based on the risk factor. In these embodiments, block 512 may either proceed to 508 or 518. In some embodiments, a risk factor may be created, but may not be used to exclude a set of pages from multi-plane reads. In these embodiments, block 510 may proceed directly to block 514. In some embodiments, risk factors may always be used to restrict offset-difference thresholds, and thus block 512 (or block 510) may proceed directly to block 516.

Figure 6:
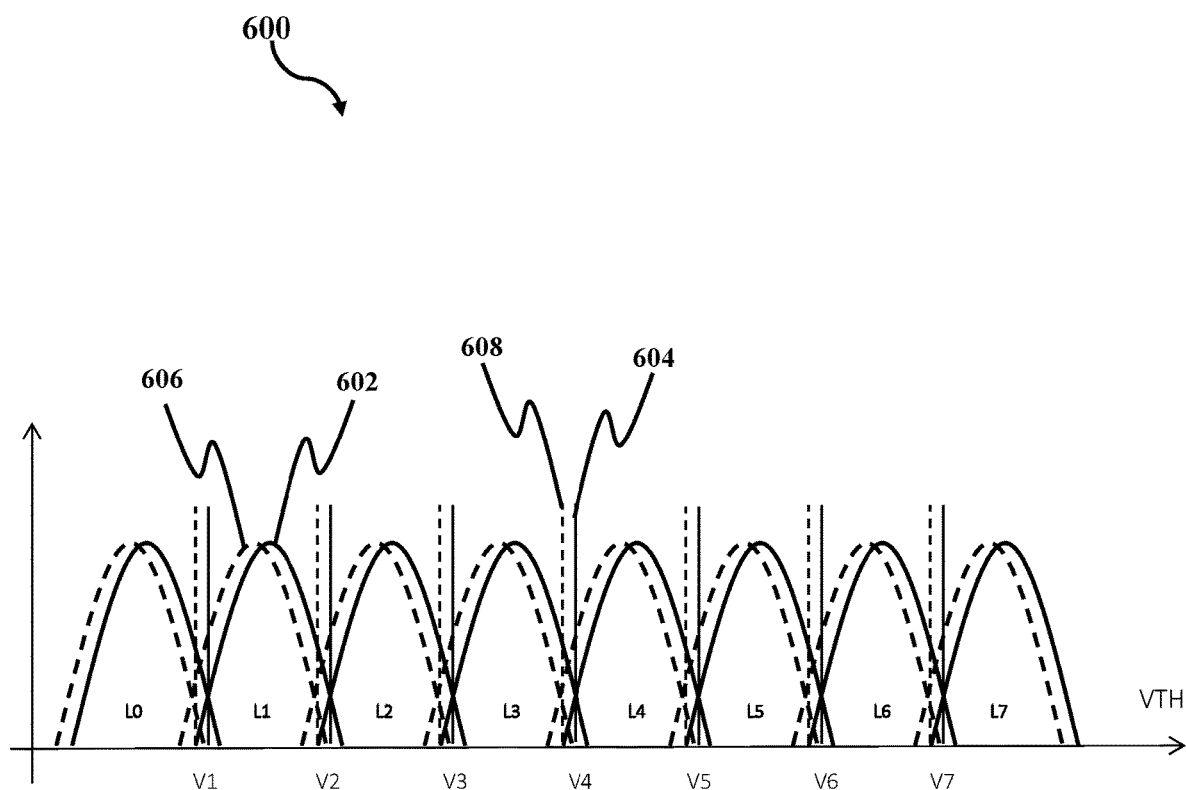
FIG. 6 depicts an example graph of a read-offset shifting phenomenon that could be addressed using a common offset in accordance with embodiments of the present disclosure.

FIG. 6, illustrates a graph 600 showing the read-offset (illustrated on the horizontal axis) shifting phenomenon of a TLC NAND flash in accordance with an example. The x-axis of the graph 600 represents the cell's threshold voltage, while the y-axis represents the corresponding cell count of a word-line in a TLC NAND memory block. In TLC NAND, each memory cell stores 3 bits of information, therefore, the VTH distributions correspond to 8 possible discrete levels (L0 through L7). The initial voltage distributions (e.g., initial distribution 602) indicate the threshold voltage levels after programming. The initial read voltages (e.g., initial read voltage 604) are indicated by solid lines and depict eight initial ideal read voltages (V1 through V7) that are optimal for the initial threshold voltage distributions (e.g., initial voltage distribution 602). The shifted voltage distributions (e.g., shifted voltage distribution 606) indicate a negative shift of the threshold voltage levels due to, for example, charge loss over time. Because of this negative shift to lower values, the initial read voltages (e.g., initial read voltage 604) are no longer optimal. Indeed, a negative offset must be applied to the read voltages in order to account for the changes of the threshold voltage distributions (e.g., from 602 to 606). The shifted ideal voltages (e.g., shifted ideal voltage 608) indicate the read voltages (V1 through V7) that are optimal for the shifted threshold voltage distributions (e.g., shifted voltage distribution 606). In general, each of the 8 levels (L0 through L7) shown in the figure may have a different shift due to charge loss effects and thus, each of the 7 read voltages (V1 through V7) may have a different optimal shift.

Typically, the memory controller can use a specific command to the memory chip to instruct the memory chip to adjust any of the read voltages V1 through V7 by means of an offset value with reference to a nominal (default) voltage value for each of the read voltages V1 through V7. The actual values of the nominal and the adjusted read voltages V1 through V7 may not be available to the memory controller. Thus, the offset values are typically represented by means of integer values, where a unit value corresponds to small voltage step, e.g., 10 mV, depending on the memory chip specifications. Therefore, in an example that is not restrictive to any specific memory chip design or implementation, an offset value of −3 may represent a negative offset of −3*10 mV=−30 mV. Assuming, for example, that the initial read voltage 604 in FIG. 6 represents the nominal voltage value for read voltage V4, a command to adjust the voltage by an integer value of −3 may represent the adjustment of read voltage V4 from initial read voltage 604 to shifted ideal voltage 608 to account for the change of distributions from the initial voltage threshold distributions 602 to the shifted voltage distributions 606 in the example of FIG. 6.

As discussed above, each word-line in a block contains so many pages as the number of bits stored in each memory cell of the word-line. For example, in a TLC NAND block, each word-line contains three pages, e.g., a lower page, an upper page and an extra page, while in a QLC NAND block, each word-line contains four pages, e.g., a lower page, an upper page, an extra page and a top page. In order to get the data for each page type in a memory block, i.e., for any lower or upper or extra or top page in a block, the memory module applies a different set of read voltage for each page type. The specific read voltages used to read a particular page type depends on the specifications of the memory chip.

In a memory chip of TLC NAND flash with 7 read voltages, for example, a lower page may be read by applying read voltage V4, an upper page may be read by applying read voltages V2 and V6, and an extra page may be read by applying read voltages V1, V3, V5 and V7. Therefore, if it is desired to adjust the read voltages of a particular page type before a read command to that particular page of the corresponding page type, e.g., upper page, then the memory controller can send a specific command to the memory chip with the offset values of each read voltage used by the memory chip to read the information of the corresponding page type, e.g., V2 and V6 for an upper page.

Figure 7:
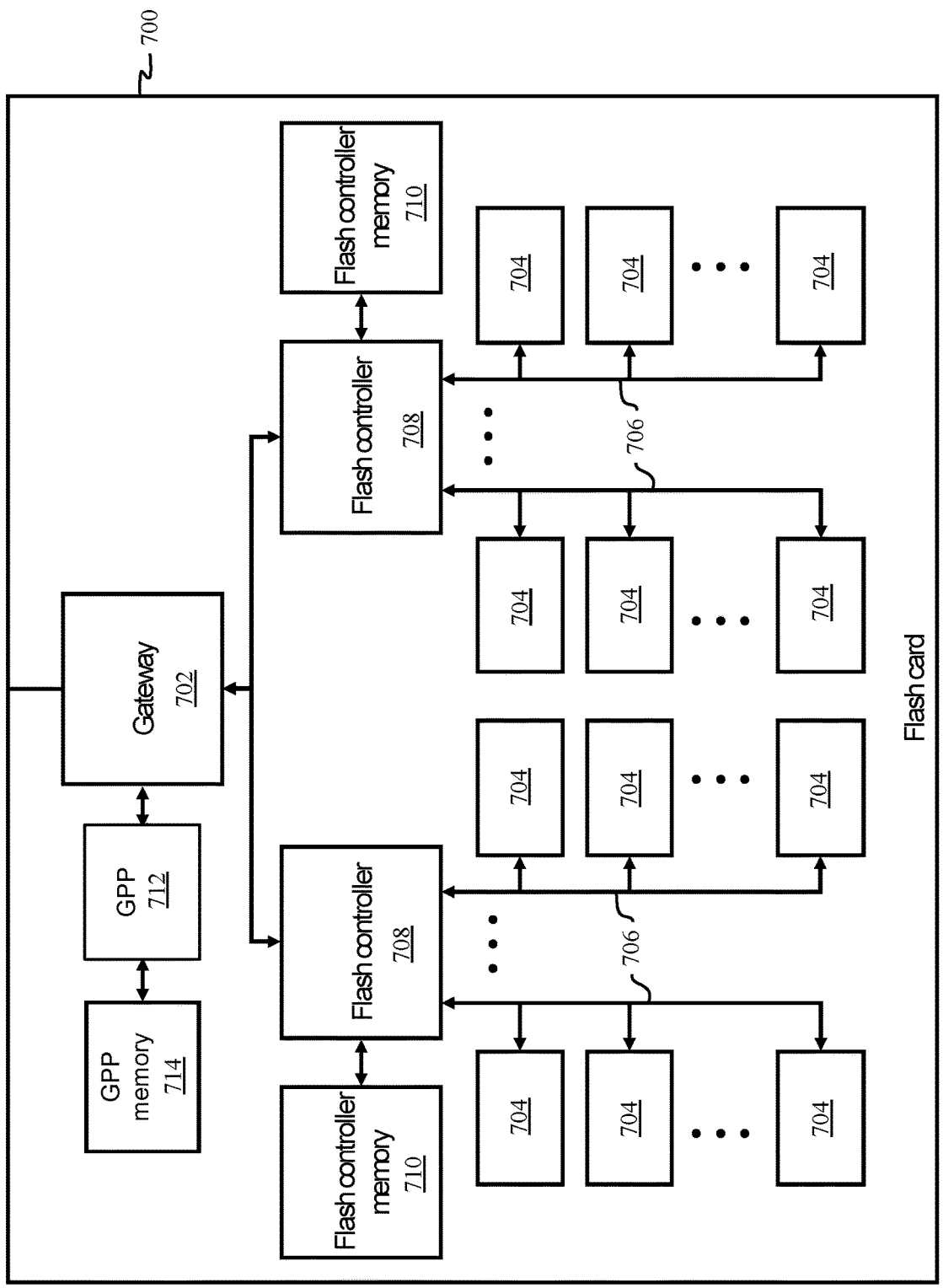
FIG. 7 illustrates a memory card with a set of memory controllers that could perform some of the methods disclosed herein.

FIG. 7 illustrates a memory card 700, in accordance with one embodiment. It should be noted that although memory card 700 is depicted as an exemplary non-volatile data storage card in the present embodiment, various other types of non-volatile data storage cards may be used in a data storage system according to alternate embodiments. It follows that the architecture and/or components of memory card 700 are in no way intended to limit the invention, but rather have been presented as a non-limiting example.

Moreover, as an option, the present memory card 700 may be implemented in conjunction with features from any other embodiment listed herein, such as those described with reference to the other FIGS. However, such memory card 700 and others presented herein may be used in various applications and/or in permutations which may or may not be specifically described in the illustrative embodiments listed herein. Further, the memory card 700 presented herein may be used in any desired environment.

With continued reference to FIG. 7, memory card 700 includes a gateway 702, a general purpose processor (GPP) 712 (such as an ASIC, FPGA, CPU, etc.) connected to a GPP memory 714 (which may comprise RAM, ROM, battery-backed DRAM, phase-change memory PC-RAM, MRAM, STT-MRAM, etc., or a combination thereof), and a number of memory controllers 708, which include Flash controllers in the present example. Each memory controller 708 is connected to a plurality of NVRAM memory modules 704 (which may comprise NAND Flash or other non-volatile memory type(s) such as those listed above) via channels 706.

According to various embodiments, one or more of the controllers 708 may be or include one or more processors, and/or any logic for controlling any subsystem of the memory card 700. For example, the controllers 708 typically control the functions of NVRAM memory modules 704 such as, data writing, data recirculation, data reading, etc. The controllers 708 may operate using logic known in the art, as well as any logic disclosed herein, and thus may be considered as a processor for any of the descriptions of non-volatile memory included herein, in various embodiments.

Moreover, the controller 708 may be configured and/or programmable to perform or control some or all of the methodology presented herein. Thus, the controller 708 may be considered to be configured to perform various operations by way of logic programmed into one or more chips, modules, and/or blocks; software, firmware, and/or other instructions being available to one or more processors; etc., and combinations thereof.

Referring still to FIG. 7, each memory controller 708 is also connected to a controller memory 710 which preferably includes a cache which replicates a non-volatile memory structure according to the various embodiments described herein. However, depending on the desired embodiment, the controller memory 710 may be battery-backed DRAM, phase-change memory PC-RAM, MRAM, STT-MRAM, etc., or a combination thereof.

Figure 8:
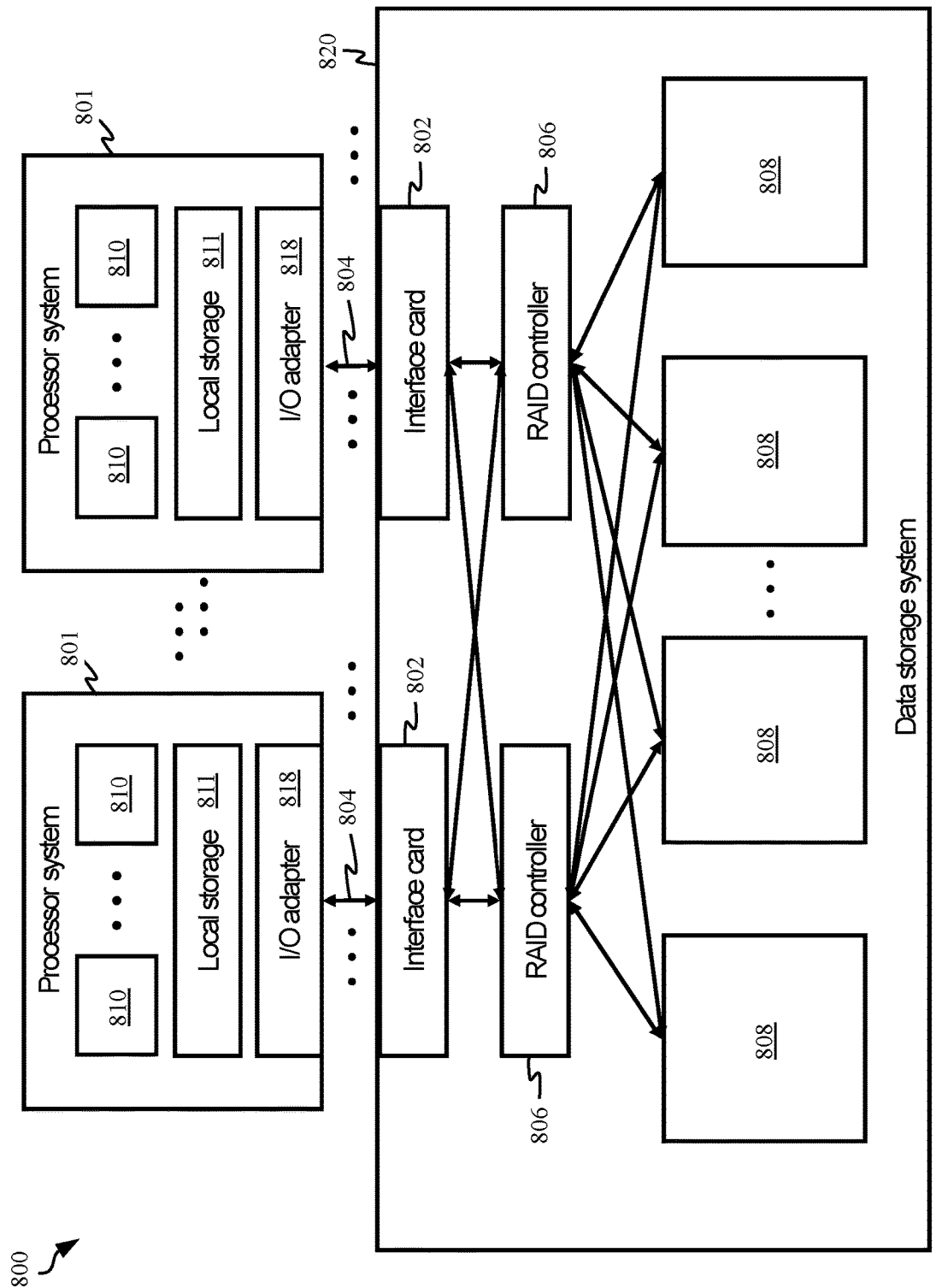
FIG. 8 depicts a data storage system in which some methods of the present disclosure could be performed.

As previously mentioned, memory card 700 may be implemented in various types of data storage systems, depending on the desired embodiment. FIG. 8 illustrates a data storage system architecture 800 according to an exemplary embodiment which is in no way intended to limit the invention. Moreover, it should be noted that the data storage system 820 of FIG. 8 may include various components found in the embodiment of FIG. 7.

Looking to FIG. 8, the data storage system 820 comprises a number of interface cards 802 configured to communicate via I/O interconnections 804 to one or more processor systems 801. The data storage system 820 may also comprise one or more Redundant Array of Independent Disks (RAID) controllers 806 configured to control data storage in a plurality of non-volatile data storage cards 808. The non-volatile data storage cards 808 may comprise NVRAM, Flash memory cards, RAM, ROM, and/or some other known type of non-volatile memory.

The I/O interconnections 804 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 806 in the data storage system 820 may perform a parity scheme similar to that employed by RAID-5, RAID-6, RAID-10, or some other suitable parity scheme, as would be understood by one of skill in the art upon reading the present descriptions.

Each processor system 801 comprises one or more processors 810 (such as CPUs, microprocessors, etc.), local data storage 811, and an I/O adapter 818 configured to communicate with the data storage system 820.

Referring again to FIG. 7, memory controllers 708 and/or other controllers described herein (e.g., RAID controllers 806 of FIG. 8) may be able to perform various functions on stored data, depending on the desired embodiment. Specifically, memory controllers may include logic configured to perform any one or more of the following functions, which are in no way intended to be an exclusive list. In other words, depending on the desired embodiment, logic of a storage system may be configured to perform additional or alternative functions, as would be appreciated by one skilled in the art upon reading the present description.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   receiving a request for a multi-plane read for a first page and a second page;
   identifying a first read offset for the first page and a second read offset for the second page;
   calculating a common offset for the first page and second page;
   calculating a first offset difference between the first read offset and the common offset;
   calculating a second offset difference between the second read offset and the common offset;
   determining that the first offset difference and the second offset difference are bound by a common-offset threshold;
   adding, based on the determining, the first page and second page to a primary multi-plane group; and
   performing a multi-plane read on the primary multi-plane group.

2. The method of claim 1, wherein performing the multi-plane read comprises sending a command to adjust a read voltage for the multi-plane read based on the common offset.

3. The method of claim 1, wherein the request is also for a third page, wherein the common offset is also for the third page, and wherein the method further comprises:
   identifying a third read offset for the third page;
   calculating a third offset difference between the third read offset and the common offset;
   detecting that the third offset difference is not bound by the common offset threshold; and
   adding, based on the detecting, the third page to a single-plane group.

4. The method of claim 3, further comprising:
   calculating, before the performing, a refined primary common offset for the pages in the primary multi-plane group; and
   wherein performing the multi-plane read comprises sending a command to adjust a read voltage for the multi-plane read based on the refined primary common offset.

5. The method of claim 3, wherein the request is also for a fourth page, wherein the common offset is for the first page, second page, third page, and fourth page, and wherein the method further comprises:
   identifying a fourth read offset for the fourth page;
   calculating a fourth offset difference between the fourth read offset and the common offset;
   detecting that the fourth offset difference is not bound by the common offset threshold;
   adding, based on the detecting that the fourth offset difference is not bound by the common offset threshold, the fourth page to the single-plane group;
   calculating a secondary common offset for the pages in the single-plane group;
   calculating a fifth offset difference between the third read offset and the secondary common offset;
   calculating a sixth offset difference between the fourth read offset and the secondary common offset;
   detecting that the fifth offset difference and the sixth offset difference are bound by a secondary common offset threshold;
   adding, based on the detecting that the fifth offset difference and the sixth offset difference are bound by the secondary common offset threshold, the third page and the fourth page to a secondary multi-plane group; and
   performing a multi-plane read on the secondary multi-plane group.

6. The method of claim 1, further comprising:
   identifying a page statistic of a third page;
   estimating, based on the page statistic, that the third page has a high risk of causing a read error if included in a multi-plane read;
   adding the third page to an exclusion list of pages to exclude from multi-plane reads;
   determining that the first page and the second page are not on the exclusion list, wherein the identifying the first read offset and the second read offset is in response to the determining that the first page and the second page are not on the exclusion list; and
   performing, based on the estimating and the adding, a single-plane read for the third page.

7. The method of claim 1, further comprising:
   calculating, in response to the receiving, a read-error risk factor for the first page and the second page; and
   determining that the read-error risk factor is below an exclusion threshold, wherein the identifying the first read offset and the second read offset is in response to the determining that the read-error risk factor is below the exclusion threshold.

8. The method of claim 7, further comprising calculating the common-offset threshold using the read-error risk factor.

9. A computer program product, the computer program product comprising a computer readable storage medium having program instructions embodied therewith, the program instructions executable by a memory controller to cause the memory controller to:
   receive a multi-plane read request for a set of pages;
   perform a pre-categorization triage on the set of pages; and
   determine, based on the pre-categorization triage, whether to exclude the set of pages from a multi-plane read;
   perform, for pages of the set of pages that are excluded from multi-plane reads in the pre-categorization triage, single plane reads;
   perform, for pages of the set of pages that are not excluded from multi-plane reads in the pre-categorization triage, multi-plane categorization, wherein the multi-plane categorization comprises:
      identifying a set of actual read offsets for the set of pages;
      calculating, using the set of actual read offsets, a common read offset;
      calculating, for each particular page in the set of pages, an offset difference, wherein each offset difference reflects the difference between an actual read offset for that particular page and the common read offset;
      determining, for each particular page in the set of pages, whether the offset difference for that particular page is below a difference threshold;
      categorizing, based on the determination, pages from the set of pages whose offset differences are below the difference threshold into a multi-plane group;
      categorizing, based on the determination, pages from the set of pages whose offset differences are above the difference threshold into a single-plane group; and
   perform, for pages categorized into the multi-plane group, a multi-plane read.

10. The computer program product of claim 9, wherein the pre-categorization triage comprises determining whether the pages are on an exclusion list.

11. The computer program product of claim 9, wherein the pre-categorization triage comprises:
calculating a read-error risk factor for the pages; and
comparing the read-error risk factor to an exclusion threshold.

12. The computer program product of claim 9, wherein the pre-categorization triage comprises:
calculating a read-error risk factor for the pages; and
determining to restrict the difference threshold based on the read-error risk factor.

13. The computer program product of claim 9, wherein the performing the multi-plane read comprises:
calculating a refined primary common offset for the pages in the multi-plane group; and
wherein performing the multi-plane read comprises sending a command to adjust a read voltage for the multi-plane read based on the refined common offset.

14. The computer program product of claim 9, wherein the program instructions executable by a memory controller to cause the memory controller to:
calculate a secondary common offset for the pages categorized in the single-plane group;
calculate, for each particular page in the single-plane group, a secondary offset difference, wherein each secondary offset difference reflects the difference between the actual read offset for that particular page and the secondary common read offset;
determine, for each particular page in the single-plane group, whether the secondary offset difference for that particular page is below a secondary difference threshold; and
categorize, based on the determination, pages from the single-plane group whose offset differences are below the difference threshold into a secondary multi-plane group.

15. A memory controller configured to perform a method, the method comprising:
receiving a multi-plane read request;
identifying a set of actual read offsets for a set of pages in the multi-plane read request;
calculating, using the set of actual read offsets, a common read offset;
calculating, for each particular page in the set of pages, an offset difference, wherein each offset difference reflects the difference between an actual read offset for that particular page and the common read offset;
comparing, for each particular page in the set of pages, that particular page's offset difference to an offset difference threshold;
categorizing, based on the comparing, a first subset of pages from the set of pages into a single-plane group;
categorizing, based on the comparing, a second subset of pages from the set of pages into a multi-plane group; and
performing a multi-plane read on the multi-plane group.

16. The memory controller of claim 15, wherein performing the multi-plane read comprises sending a command to adjust a read voltage for the multi-plane read based on the common read offset.

17. The memory controller of claim 15, wherein the method that the memory controller is configured to perform further comprises:
calculating, before the performing, a refined primary common offset for the pages in the multi-plane group; and
wherein performing the multi-plane read comprises sending a command to adjust a read voltage for the multi-plane read based on the refined common read offset.

18. The memory controller of claim 15, wherein the method that the memory controller is configured to perform further comprises:
calculating a secondary common offset for the first subset of pages categorized in the single-plane group;
calculating, for each particular page in the first subset of pages, a secondary offset difference, wherein each secondary offset difference reflects the difference between the actual read offset for that particular page and the secondary common read offset;
determining, for each particular page in the first subset of pages, whether the secondary offset difference for that particular page is below a secondary difference threshold; and
categorizing, based on the determination, pages from the first subset of pages whose offset differences are below the difference threshold into a secondary multi-plane group.

19. The memory controller of claim 15, wherein the method that the memory controller is configured to perform further comprises:
performing a pre-categorization triage on the set of pages, wherein the pre-categorization triage comprises determining whether the pages are on an exclusion list; and
determining, based on the pre-categorization triage, whether to exclude the set of pages from the multi-plane read.

20. The memory controller of claim 19, wherein the pre-categorization triage further comprises:
calculating, in response to the receiving, a read-error risk factor for a page in the set of pages; and
determining whether the read-error risk factor is below an exclusion threshold.

* * * * *